(12) United States Patent
Leibfritz et al.

(10) Patent No.: US 8,981,758 B2
(45) Date of Patent: Mar. 17, 2015

(54) MEASUREMENT BRIDGE IN A PRINTED CIRCUIT BOARD

(75) Inventors: Martin Leibfritz, Munich (DE); Werner Held, Pocking (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 123 days.

(21) Appl. No.: 13/401,302

(22) Filed: Feb. 21, 2012

(65) Prior Publication Data

US 2013/0214762 A1    Aug. 22, 2013

(30) Foreign Application Priority Data

Feb. 20, 2012    (EP) ..................................... 12156174

(51) Int. Cl.
*G01R 17/02*    (2006.01)
*G01R 27/04*    (2006.01)
*G01R 27/32*    (2006.01)

(52) U.S. Cl.
CPC ................ *G01R 27/04* (2013.01); *G01R 27/32* (2013.01)
USPC ................................ 324/98; 343/860; 333/25

(58) Field of Classification Search
None
See application file for complete search history.

(56) References Cited

U.S. PATENT DOCUMENTS

| | | | | |
|---|---|---|---|---|
| 7,126,347 B1* | 10/2006 | Bradley | ......................... | 324/657 |
| 7,133,610 B1* | 11/2006 | Shimura et al. | .................. | 398/15 |
| 7,531,291 B2* | 5/2009 | Sugasaki | ..................... | 430/284.1 |
| 7,961,064 B2* | 6/2011 | Kearns et al. | .................. | 333/109 |
| 8,207,797 B2* | 6/2012 | Wu et al. | .......................... | 333/26 |
| 2006/0001505 A1* | 1/2006 | Fojas | ............................ | 333/112 |
| 2012/0008504 A1* | 1/2012 | Zhang | ............................ | 370/241 |

* cited by examiner

*Primary Examiner* — Arleen M Vazquez
*Assistant Examiner* — Feba Pothen
(74) *Attorney, Agent, or Firm* — Ditthavong & Steiner, P.C.

(57) ABSTRACT

A measurement bridge, in particular for a network analyzer, including a reference port, a central output port and a balun having a first balun input connector and a first and a second balun output connector. The first balun output connector is connected to a first signal path and the second balun output connector is connected to a second signal path. The central output port is connected to the first signal path, and the reference port is connected to the second signal path. The electrical parameters of the first signal path and the second signal path are approximately the same.

13 Claims, 3 Drawing Sheets

MEASUREMENT BRIDGE IN A PRINTED CIRCUIT BOARD

BACKGROUND OF THE INVENTION

1. Field of the Invention

The invention relates to a measurement bridge that is created on a printed circuit board and that can be used for example but not limiting within a network analyzer for forwarding the excitation signal to a reference port and a central output port having a device under test connected thereto and for forwarding a reflected signal from the device under test to a measurement port.

2. Discussion of the Background

An excitation signal is generated by a network analyzer for analyzing a device under test (DUT). The excitation signal is fed to said device under test via ports thereof. For example, in order to determine an input reflection coefficient and a forward transmission coefficient, an output reflection coefficient and a reverse transmission coefficient, the excitation signal is fed to the device under test, which comprises an input gate and an output gate, via said input gate or said output gate. In order to determine the reflection coefficients and the transmission coefficients, the respective incident and the returning waves of the excitation signal at the input gate and/or the output gate of the test object are to be determined. In order to determine the frequency range at which the excitation signal passes through the test object, and the frequency range at which the excitation signal is reflected at the input gate and/or the output gate of the test object, the network analyzer drives the frequency of the excitation signal through a predetermined frequency range in a frequency sweep.

A network analyzer of this type is known, for example, from US 2008/290880 A1. This publication shows a measurement bridge that can be used within a network analyzer. A reference signal corresponding to the excitation signal can be extracted from a reference channel and a measuring signal corresponding to a signal reflected from the measuring object can be extracted from a measuring channel. The measuring bridge comprises a resistive bridge and at least one hybrid coupler which is connected to the resistive bridge in series. The measurement bridge is operated as a resistive bridge in low frequency range and as a hybrid coupler in an upper frequency range.

It is a drawback of the confirmation of US 2008/290880 A1 that the measurement bridge comprises a resistive bridge and at least one hybrid coupler which are used for different frequencies. Thus, further circuit elements like a selecting unit or a relay-switch are needed to feed a signal either from the resistive bridge or from the at least one hybrid coupler to the Analog/Digital-converter. The use of the plurality of the hybrid couplers as well as of the resistive bridge and the switching unit leads to additional calibration routines and also reduces the sensitivity of the network analyzer.

SUMMARY OF THE INVENTION

The present invention advantageously provides embodiments of a measurement bridge that is very fast and accurate over a wide frequency range.

The inventive measurement bridge which is used in a network analyzer comprises a reference port, a central output port and a balun having a first balun input connector and a first and a second balun output connector, wherein the first balun output connector is connected to a first signal path and the second balun output connector is connected to a second signal path, wherein the central output port is connected to the first signal path, wherein the reference port is connected to the second signal path, wherein the electrical parameters of the first signal path and the second signal path are approximately the same.

It is very advantageous that the balun is used for splitting up an unbalanced signal into two balanced signals having a phase difference of 180°, wherein the electrical parameters of the first signal path and the second signal path are the same. This ensures that both signals are the same except for their 180° phase difference at the end of the first signal path and the second signal path. An excitation signal fed to the first balun input connector is therefore transformed to two-balanced signals having a 180° phase difference.

It is also advantageous if the measurement bridge further comprises a measurement port having the first and the second signal path joined together at the measurement port. As already described, a balanced signal at the first balun output connector and the second balun output connector has a phase difference of 180° at the measurement port.

It is further advantageous if the measurement bridge has a first matching unit which is integrated in the connection between the first signal path and the central output port and if a second matching unit is integrated between the first and the second signal path and the measurement port. This ensures that all signal lines which are connected to the first matching unit and to the second matching unit see an impedance at the end of the line which is the same as their own impedance. Therefore, no reflection occurs between the junction of the first signal path and the central output port and between the first and the second signal path and the measurement port.

It is further beneficial if the first matching unit and the second matching unit of the measurement bridge comprise a first and a second and a third and a fourth resistor which are composed of thick film resistors dispensed on a ceramic layer and trimmed by a laser to their desired values. In this case the matching units are formed on separate ceramic layers. These ceramic layers can be trimmed until the desired accuracy is reached. Then the ceramic layer can be mounted on the measurement bridge which is composed of a printed circuit board. Thus, no further calibration is needed.

It is further advantageous if the measurement bridge is extended by a direct current (DC)-Feed using a capacitor in series around a Bias-Tee between the first matching unit and the central output port. This allows measuring DUTs like a transistor where the operation point can be adjusted.

It is further beneficial if a circuitry of the second signal path comprises at least one resistor that is connected between ground and the second signal path and at least another resistor that is connected in series within the second signal path and a transmission line so that the circuitry therefore ensures that the electrical length and the attenuation of the second signal path is approximately the same as the length and the attenuation of the first signal path. This ensures that the excitation signal at the first balun output connector travelling through the first signal path to the measurement port is exactly the same as the excitation signal at the second balun output connector travelling through the second signal path with the only difference that there is a 180° phase difference between them so that both signals cancel themselves at the measurement port in case the central output port is properly matched. In this case, only the reflected signal from the central output port is measured at the measurement port.

It is further advantageous if the measurement bridge has a recess which is formed within the printed circuit board on one side so that a metallic layer of a top layer or bottom layer of the other side is visible wherein at least one resistor and at least another resistor are arranged on that metallic layer. This ensures that the parasitic capacitance is minimized within the second signal path.

It is further favorable if the balun comprises coaxial cable that is wound up within a ferrite, wherein the balun is mounted on the printed circuit board and wherein no metal layer is formed within the printed circuit board beneath the balun. If the balun is built by using a ferrite it can be used for lower frequencies, too. Therefore, the whole usable frequency range is enhanced. This effect is further increased if there is not any metal layer near the balun. It is necessary that the outer conductor of the coaxial cable is insulated by means of a shrink hose or a protective lacquer.

BRIEF DESCRIPTION OF THE DRAWINGS

Different embodiments of the present invention are described exemplary in the following with reference to the description. This is done by the way of example only, without limitation. Identical elements have the same reference signs. The figures in the drawings show in detail.

DETAILED DESCRIPTION OF EXEMPLARY EMBODIMENTS OF THE INVENTION

Figure 1:
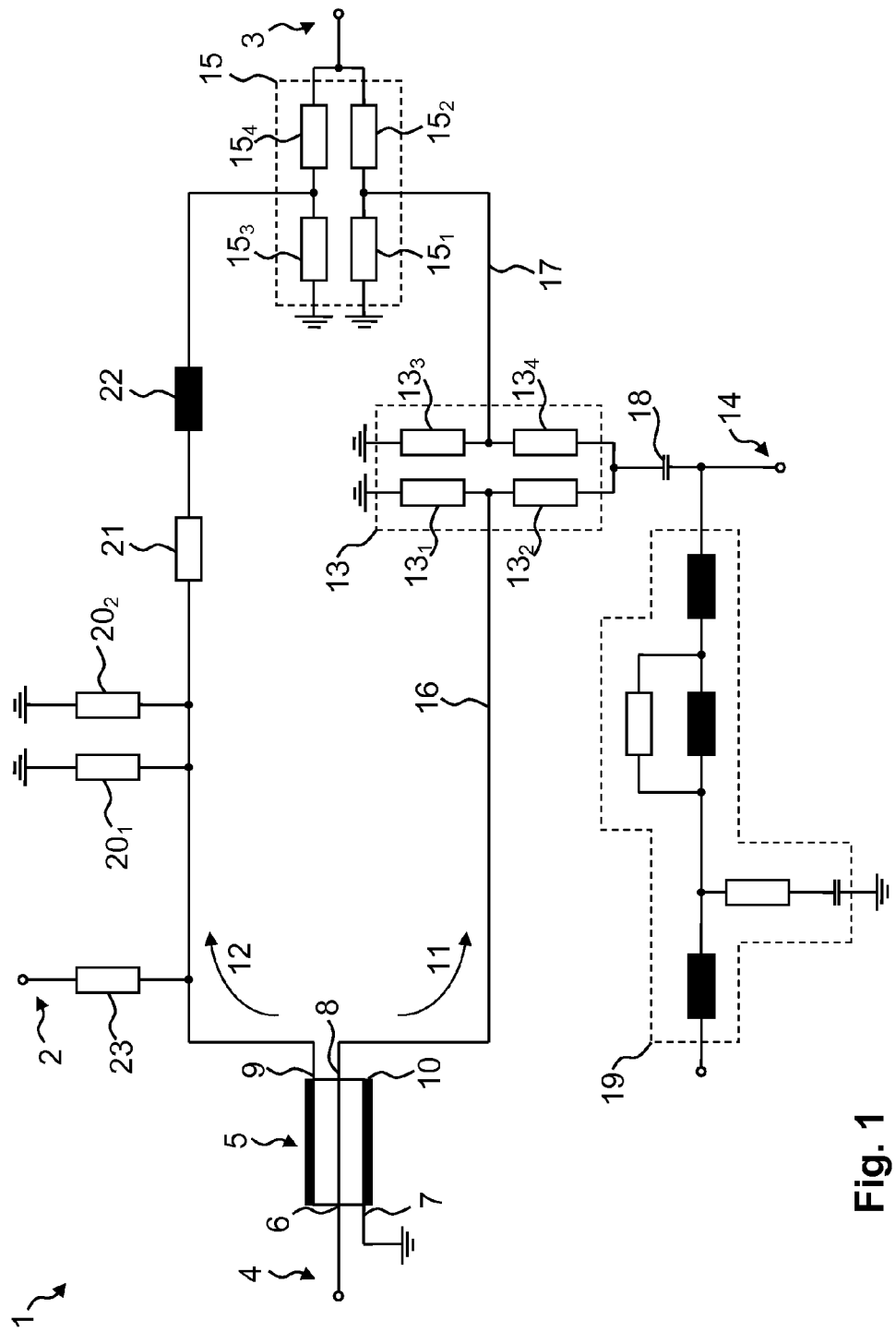
FIG. 1 a schematic diagram of the measurement bridge according to an embodiment of the present invention.

FIG. 1 shows a schematic diagram of the measurement bridge 1 according to an embodiment of the present invention. The measurement bridge 1 is used to feed an excitation signal to a device under test (DUT) and to a reference port 2.

The measurement bridge 1 is further used to feed a reflected signal from the DUT or a signal transmitted through the DUT to a measurement port 3. The measurement bridge 1 with respect to the present invention can be used over a wide frequency range as explained below.

The measurement bridge 1 which is used in particular within a network analyzer comprises a signal generator port 4. The signal generator port 4 is connected to a first balun input connector 6. The second balun input connector 7 is preferably connected to ground. The balun 5 has also a first balun output connector 8 and a second balun output connector 9. The balun 5 can be made by using a coaxial cable having an inner conductor and an outer conductor. The inner conductor is connected to the first balun input connector 6.

In the following a test signal is fed through the signal generator port 4 to the first balun input connector 6 and therefore to the inner conductor of the balun 5. The outer conductor of the balun 5 is connected at one end to the second balun input connector 7 and is therefore connected to ground as shown in FIG. 1. The other end of the inner conductor of the balun 5 is connected to the first balun output connector 8. The other end of the outer conductor of the balun 5 is connected to the second balun output connector 9. The coaxial cable is wound up and surrounded by a ferrite 10. The ferrite 10 increases the inductance of the balun 5 and allows that the balun 5 can be used for low frequencies down to for example about 9 kHz.

The test signal fed to the balun 5 through the first balun input connector 6 is an unbalanced signal having its reference to ground. The balun 5 is used to obtain a balanced signal at the first balun output connector 8 and the second balun output connector 9 having ideally the same amplitude, but a phase shift of 180°.

The first balun output connector 8 is connected to a first signal path 11 and the second balun output connector 9 is connected to a second signal path 12. As described below, the electrical parameters of the first signal path 11 and the second signal path 12 have to be approximately the same.

To make sure that the excitation signal on the first signal path 11 is fed to the device under test as well as to the measurement port 3 without any reflections, a first matching unit 13 is preferably integrated within the connection between the first signal path 11 and the central output port 14. Furthermore, a second matching unit 15 is preferably integrated between the first signal path 11 and the second signal path 12 and the measurement port 3. The first matching unit 13 and the second matching unit 15 can be realized equally as described below.

Having the first matching unit 13 being integrated within the first signal path 11, the first signal path 11 is divided into two signal lines 16, 17. A first signal line 16 connects the first balun output port 8 to the first matching unit 13. A second signal line 17 connects the first matching unit 13 to the second matching unit 15.

The first matching unit 13 transforms the impedance of the first signal line 16 and the second signal line 17 to an impedance that is approximately the same as the impedance of the central output port 14. The same also applies to the second matching unit 15 which transforms the impedance of the second signal line 17 and the impedance of the second signal path 12 to an impedance that is approximately the same as the impedance of the measurement port 3.

The first matching unit 13 comprises four resistors $13_1$, $13_2$, $13_3$, $13_4$ having a first resistor $13_1$ and a second resistor $13_2$ connected to the first signal line 16 and a third resistor $13_3$ and a fourth resistor $13_4$ connected to the second signal line 17. The first and the third resistor $13_1$, $13_3$ of the first matching unit 13 are further connected to ground wherein the second and the fourth resistor $13_2$, $13_4$ of the first matching unit 13 are also connected to the central output port 14 and therefore to each other.

The same also applies for the second matching unit 15. The second matching unit 15 also comprises four resistors $15_1$, $15_2$, $15_3$, $15_4$ having a first resistor $15_1$ and a second resistor $15_2$ connected to the second signal line 17 and a third resistor $15_3$ and a fourth resistor $15_4$ connected to the second signal path 12. The first resistor $15_1$ of the second matching unit 15 and the third resistor $15_3$ of the second matching unit 15 are connected to ground, wherein the second resistor $15_2$ of the second matching unit 15 and the fourth resistor $15_4$ of the second matching unit 15 are connected to the measurement port 3 and therefore to each other.

In the following, the mode of operation of the first matching unit 13 will be explained. If the first signal line 16 and the second signal line 17 have an impedance of for example 50 Ohm, this impedance would be transformed to 25 Ohm according to the parallel structure of both signal lines 16, 17. Therefore, if the central output port 14 would also have an impedance of 50 Ohm, there would be a mismatch between the first signal line 16 and the second signal line 17 and the central output port 14. Therefore, the first matching unit 13 has to transform the impedance of the first signal line 16 and the second signal line 17 to 100 Ohm so that the central output port 14 will still see an impedance of 50 Ohm as a result of the parallel structure of the two signal lines 16, 17. The same also applies to the second matching unit 15 which transforms the impedance of the second signal line 17 and the second signal path 12 in such a way that the measurement port 3 sees an impedance which has the same value as the impedance of the measurement port 3 itself.

In order that the transformed impedance of the first signal line 16 and the second signal line 17 is approximately the same as the impedance of the central output port 14, the resistors $13_1$, $13_2$, $13_3$, $13_4$ of the first matching unit 13 have to be manufactured very accurately with respect to their resistance value. The same also applies for the resistors $15_1$, $15_2$, $15_3$, $15_4$ of the second matching unit 15.

The measurement bridge 1 can also be extended by a DC-Feed using a capacitor 18 in series around a Bias-Tee 19 between the first matching unit 13 and a central output port 14. The capacitor 18 decouples the central output port 14 from the first signal path 11 and vice versa with respect to a DC voltage. The Bias-Tee 19 comprises several conductors and resistors that allow feeding a DC voltage to the central output port 14 and also prevent that the excitation wave is transmitted to the voltage source. The Bias-Tee 19 is only optional and can be used for example for adjusting the operation point of an active DUT like a transistor.

There are also several resistors connected to the second signal path 12. It is noted that at least one resistor $20_1$, $20_2$ is connected between ground and the second signal path 12. Furthermore, there is at least another resistor 21 that is connected in series within the second signal path 12. The second signal path 12 further comprises a transmission line 22. In addition, as already described, the reference port 2 is also connected through a resistor 23 to the second signal path 12. The values of the at least one resistor $20_1$, $20_2$ the other resistor 21, the resistor 23 and the transmission line 22 have to be chosen in such a manner that the electrical parameters of the second signal path 12 match with the electrical parameters of the first signal path 11. For example, the attenuation of the second signal path 12 has to be the same as the attenuation of the first signal path 11. Furthermore, the electrical length of the second signal path 12 has to be the same as the electrical length of the first signal path 11. However, the design of the values of the at least one resistor $20_2$, $20_2$ the other resistor 21, the resistor 23 and the transmission line 22 should also consider a difference in length between the inner conductor and the outer conductor of the balun 5 and moreover the matching network 13. If those values are chosen properly, the excitation signal at the second signal path 12 has the same amplitude at the measurement port 3 as the excitation signal at the first signal path 11, but with an opposite phase.

In the following, an example will be described on how to measure the reflection parameter $S_{11}$ of a device under test. For this purpose a device under test has to be connected to the central output port 14. A test signal is fed to the signal generator port 4 and is transformed by the balun 5 into a balanced signal. The balanced signal is output through the first balun output connector 8 and the second balun output connector 9. The signal travels through the first signal path 11 and a part of this signal will travel through the first matching unit 13 to the central output port 14. Another part will travel through the first matching unit 13 to the second matching unit 15. If the device under test is matched properly, for example if the device under test has an impedance of 50 Ohm, there will no signal be reflected back to the first matching unit 13. Therefore, the only signal which will travel through the second signal line 17 to the second matching unit 15 is a part of the balanced signal that travels through the first signal line 16 to the second signal line 17.

On the other hand, the balanced signal which is output through the second signal path 12 will be fed to a reference port 2 in order to determine the current amplitude and the current phase. Furthermore, the signal travelling on the second signal path 12 will be attenuated through the at least one resistor $20_2$, $20_2$ and the other resistor 21 and delayed through the transmission line 22. The signal which travels through the second signal path 12 and which joins the other signal travelling through the second signal line 17 at the measurement port 3 both have the same amplitudes, but a phase difference of 180°. Therefore, both signals cancel themselves at the measurement port 3. The network analyzer will not measure any signal at the measurement port 3 which means that no signal is being reflected from the device under test.

On the other hand, if the device under test does not have an impedance of exactly 50 Ohm, a part of the signal which travels through the first signal line 16 to the central output port 14 and to the DUT will be reflected by the device under test. The signal travels back to the first matching unit 13 and is being split up within the matching unit 13. A part of this signal travels through the second signal line 17 and the other part travels through the first signal line 16. It is clear from the description above that the network analyzer can measure a signal on the measurement port 3, because of the additional signal which is being reflected from the device under test and which travels back through the first matching unit 13 and the second signal line 17. The other part of the signal which travels back through the first matching unit 13 and the first signal line 16 will be attenuated within the remaining circuit so that the remaining part of this signal has a much lower amplitude than the other part of the signal which travels through the second signal line 17. The remaining circuit comprises the balun 5 and the resistors connected to the second signal path 12. Therefore, the remaining part of the signal travelling through the second signal path 12 cannot disturb the measurement.

The same also occurs if the measurement bridge 1 is used to measure the transmittance of an excitation signal through a device under test. In this case no test signal is fed to the signal generator port 4. Therefore, when measuring the transmittance, the signal which is output from the device under test travels through the first matching units 13 and the second signal line 17 to the second matching unit 15 and the measurement port 3. Another part of the signal also travels through the first signal line 16 to the balun 5, where it is attenuated in such a way that the remaining part of this signal travelling through the second signal path 12 has a much lower amplitude than the signal travelling through the second signal line 17. As a result, the network analyzer measures only the signal travelling through the first matching unit 13 and the second signal line 17. Thus, the transmittance parameter $S_{21}$ and $S_{12}$ can be measured very accurately.

Figure 2:
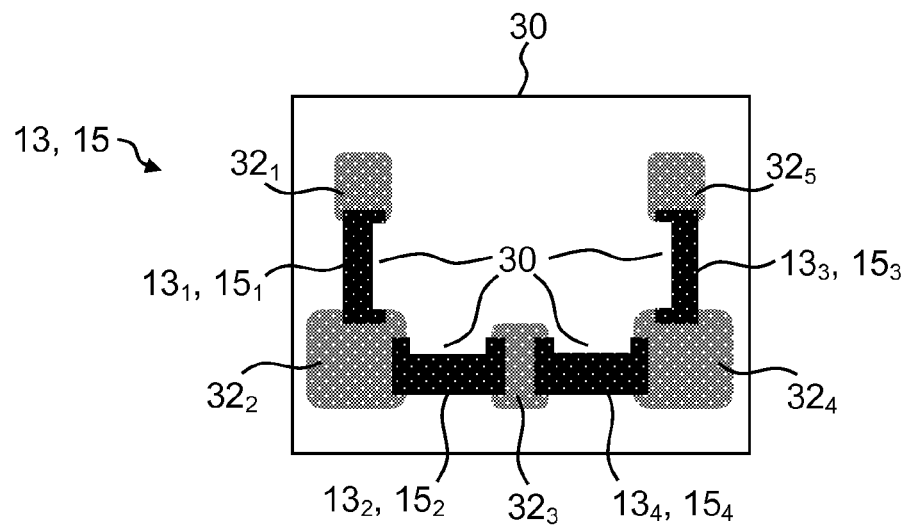
FIG. 2 a simplified footprint of a matching unit of the measurement bridge according to an embodiment of the present invention.

FIG. 2 shows a footprint of the matching unit 13, 15 of the measurement bridge 1 according to an embodiment of the present invention. The matching unit 13, 15 comprises, as already described, four resistors $13_1$ to $13_4$ or $15_1$ to $15_4$. The values of these resistors $13_1$ to $13_4$ or $15_1$ to $15_4$ have to be adjusted precisely to their desired values. Thus, it is not possible to select these resistors out of a pool of standard elements, for example SMD-elements, because the variation in the resistance value would be too high. This would result in a mismatch between the central output port 14, the first signal line 16, the second signal line 17 and the second signal path 12. Therefore, these resistors $13_1$ to $13_4$ and $15_1$ to $15_4$ are created by using a thick film paste which is dispensed upon a ceramic layer 30. It is desirable that these resistors $13_1$ to $13_4$ and $15_1$ to $15_4$ are thick film resistors, because the risk of an electrostatic discharge (ESD) is given. Those thick film resistors $13_1$ to $13_4$ and $15_1$ to $15_4$ are further trimmed to their desired values by using a laser system.

It is shown in FIG. 2 that the surface of those resistors $13_1$ to $13_4$ and $15_1$ to $15_4$ is not a rectangle because minor parts of the thick film resistor paste have been removed. Those gaps 31 arising where the minor parts have been removed result in an increase of the nominal resistance value. Therefore, the thick film resistor paste is dispensed in such a way that the resistance value is lower than the desired resistance value. After the thick film resistor paste is deposited, a laser is used to remove desired pieces of the paste until the desired resistance value is obtained. Successive probing is carried out to determine the current resistance value. This is done by using probe heads and by further applying a voltage between the individual solder pads $32_1$, $32_2$, $32_3$, $32_4$, $32_5$.

FIG. 2 also shows various solder pads $32_1$, $32_2$, $32_3$, $32_4$, $32_5$ which connect the individual thick film resistors $13_1$ to $13_4$ and $15_1$ to $15_4$ to each other. The solder pad $32_3$ is connected to the central output port 14. The solder pads $32_1$ and $32_5$ are connected to ground, wherein the solder pads $32_2$ and $32_4$ are connected to the first signal line 16 and to the second signal line 17.

After the matching unit 13, 15 is produced, it is certain that the resistors $13_1$ to $13_4$ and $15_1$ to $15_4$ have the desired resistance values. In the following, the matching unit 13, 15 can be loaded into a feeding unit used for the automatic assembly of the printed circuit board 50. After a reflow process the matching unit 13 and especially the solder pads $32_1$ to $32_5$ are electrically conducted with the printed circuit board 50 and therefore with the measurement bridge 1 itself.

Figure 3A:
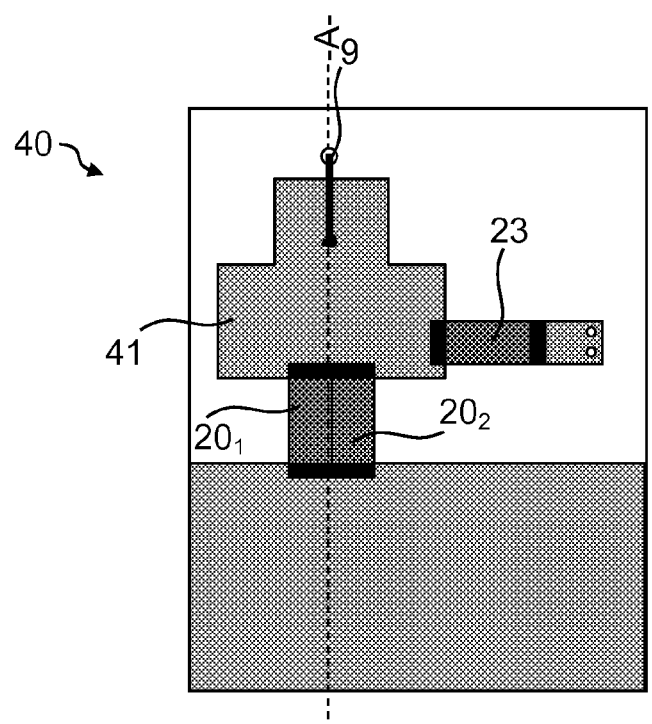
FIG. 3A a simplified footprint of a recess comprising several resistors of the measurement bridge according to an embodiment of the present invention.

FIG. 3A shows a footprint of a recess 40 comprising several resistors $20_1$, $20_2$, 23 of the measurement bridge 1 according to an embodiment of the present invention. As being described in the following, the structure shown in FIG. 3A is formed within a recess 40 of the printed circuit board 50. More precisely, FIG. 3A shows a part of the second signal path 12. It is shown that the second balun output connector 9 is connected to an isolated metal layer 41. Furthermore, there are two resistors $20_1$, $20_2$ in parallel thereby connecting the isolated metal layer 41 with the ground layer. In order to minimize the parasitical effects, both resistors $20_1$, $20_2$ have to be placed near to each other. However, those resistors $20_1$, $20_2$ can be MELF-resistors (metal electrode faces). Those resistors $20_1$, $20_2$ have the desired RF-properties as well as the required electrostatic discharge immunity. Those resistors $20_1$, $20_2$ are used to attenuate the excitation signal travelling through the second signal path 12. Furthermore, FIG. 3A shows also the resistor 23 which connects the reference port to the second signal path 12. This resistor is of the same type as the other two resistors $20_1$, $20_2$.

Figure 3B:
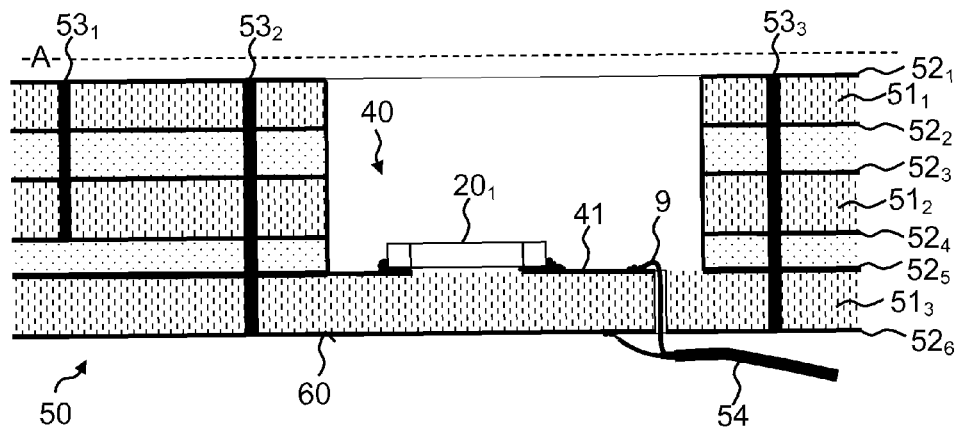
FIG. 3B a cross-sectional view of the recess within the printed circuit board of the measurement bridge according to an embodiment of the present invention.

FIG. 3B shows a cross-sectional view of the recess 40 within the printed circuit board 50 of the measurement bridge 1 according to an embodiment of the present invention. The sectional view is across the dashed -A- line as drawn in FIG. 3A. The printed circuit board 50 shown in FIG. 3B has for example six layers $52_1$ to $52_6$. However, it is also possible that the printed circuit board 50 has more or less than six layers $52_1$ to $52_6$. There are three substrate layers $51_1$, $51_2$, $51_3$ each of them holding one metal layer $52_1$, $52_2$ and $52_3$, $52_4$, and $52_5$, $52_6$ on each side. Each substrate layer $51_1$, $51_2$, $51_3$ together with its corresponding metal layer $52_1$ to $52_6$ is attached to the other substrate layer $51_1$ to $51_3$ by using an adherent material. These techniques are well-known within the manufacturing of printed circuit boards 50.

FIG. 3B also shows several VIAs $53_1$, $53_2$, $53_3$ (vertical interconnect access). Those VIAs are used to connect different metal layers $52_1$ to $52_6$ to each other. Furthermore, as already mentioned above, a recess 40 is shown within the printed circuit board 50. The recess 40 is obtained by milling the printed circuit board 50. As shown in FIG. 3B the recess 40 is formed within the printed circuit board 50 so that a metal layer $52_2$ or $52_5$ of the outermost substrate layer $51_1$ or $51_3$ is visible. This means that the milling machine mills through every substrate layer $51_1$ to $51_3$ and metal layer $52_1$ to $52_6$ except for the outermost substrate layer $51_1$ or $51_3$ and the thereto corresponding metal layers $52_1$ and $52_2$ or $52_5$ and $52_6$. The metal layer $52_2$ or $52_5$ that has to be uncovered consists of a thicker metal, i.e. through additional copper. This ensures that despite of tolerances within the milling-process the desired metal layer $52_5$ can be uncovered without any problems. The structure shown in FIG. 3A is milled within the printed circuit board 50 shown in FIG. 3B.

FIG. 3B shows a resistor $20_1$ which is connected to the ground layer on one side and to the isolated metal layer 41 on the other side. The isolated metal layer 41 is also directly connected to the second balun output connector 9 (e.g. by means of soldering). The metal layer 41 is that part of the metal layer $52_5$ that is uncovered by the milling-process. Furthermore, an isolated coaxial cable 54 is shown which comprises an isolated outer conductor and an inner conductor. It is necessary that the outer conductor of the coaxial cable is isolated by means of a shrink hose or a protective lacquer from the ferrite core of the balun 5 as well as the remaining outer conductors within the coil. The outer conductor is, as described above, connected to the second balun output connector 9. The inner conductor is connected to the first balun output connector 8. Because of the recess 40, the parasitical effects are minimized which ensures that the second signal path has the same properties as the first signal path even over a wide frequency band, i.e. 9 kHz to 14 GHz for example.

Figure 4:
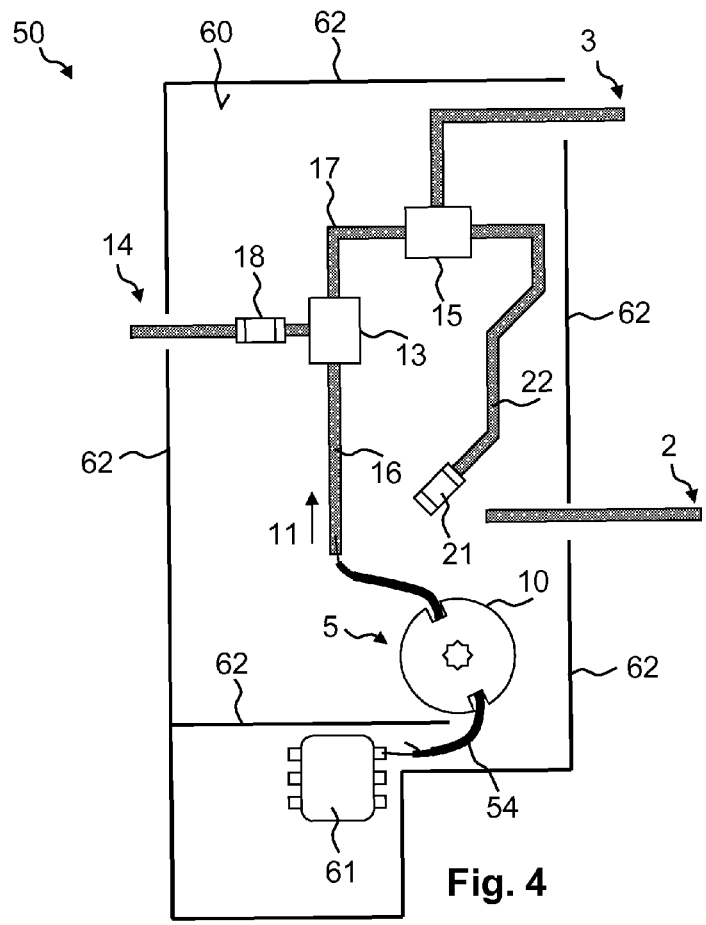
FIG. 4 a simplified footprint of a top layer of the printed circuit board of the measurement bridge according to an embodiment of the present invention.

FIG. 4 shows a footprint of a top layer 60 of the printed circuit board 50 of the measurement bridge 1 according to an embodiment of the present invention. In this case, the top layer 60 is the same layer as the metal layer $52_6$. The layer shown in FIG. 4 can also be the bottom layer. The solid lines 62 represent a large number of VIAs which are placed closely together and therefore enhance the immunity of the circuit against electromagnetic radiation which could otherwise couple from one circuit part to the other.

The circuit element 61 represents a simplified signal generator. The circuit element 61 therefore generates the test signal. This test signal is fed to the coaxial cable 54 more precisely to the inner conductor of the coaxial cable 54. The outer conductor is therefore connected to the ground layer. As already described, the coaxial cable 54 is wound up within a ferrite 10. This structure therefore forms the balun 5. The inner conductor of the other end of the coaxial cable 54 is connected to the first signal path 11, more precisely to the first signal line 16. The first signal line 16 leads then to the first matching unit 13. The first matching unit 13 is connected to the central output port 14 for example by using an optional capacitor 18. However, the possibility of a DC-Feed is not shown in FIG. 4.

The first matching unit 13 is also connected to the second signal line 17. The second signal line 17 is also connected to the second matching unit 15. The second matching unit 15 is further connected to the measurement port 3. Furthermore, the top layer 60 shown in FIG. 4 shows also the other resistor 21 and the transmission line 22. The other resistor 21 is connected to the isolated metal layer 41 by using VIAs which are not shown in FIG. 3B and FIG. 4. The transmission line 22 which is also part of the second signal path 12 connects the other resistor 21 which is placed in series within the second signal path to the second matching unit 15. It has to be noted that the length of the transmission line 22 has to be adjusted very precisely, when thinking that the frequencies of operation rise up to 14 GHz. Only in this case, it is assured that a phase difference between the excitation signal travelling through the first signal path 11 and the second signal path 12 has an angle of exactly 180° at the measurement port 3. Furthermore, FIG. 4 also shows the signal line to the reference port 2. It is noted that the recess 40 is on the other side of the substrate layer $51_3$ of the metal layer $52_6$ shown in FIG. 4. It is also noted that it is very beneficial if no metal layer $52_1$ to $52_6$ is beneath the balun 5. Thus, the frequency range can further be increased.

Furthermore, it is very beneficial that the whole measurement bridge 1 is built on a single printed circuit board 50 and that no switches like transistors have to be used. In addition, the measurement bridge 1 does also not use different couplers for different frequency ranges. The term that the electrical parameters of the first signal path and the second signal path are approximately the same means that for the desired frequency the attenuation and the electrical length of each signal path differs only to a negligible extent with respect to the desired operating conditions (i.e. maximum frequency). Therefore, it is very advantageous that changes within the balun 5 according to changes in the operating temperature or the age affect the first signal path 11 and the second signal path 12 in the same way. Thus, the measurement bridge 1 is very accurate, even over a long time. All features shown above can be combined together in any order.

What is claimed is:

1. A measurement bridge comprising:
a reference port;
a measurement port;
a central output port; and
a balun having a first balun input connector and a first and a second balun output connector,
wherein the first balun output connector is connected to a first signal path and the second balun output connector is connected to a second signal path,
wherein the central output port is connected to the first signal path,
wherein the reference port is connected to the second signal path,
wherein the electrical parameters of the first signal path and the second signal path are approximately the same,
wherein the measurement port joins the first signal path and the second signal path together,
wherein a first matching unit is integrated in the connection between the first signal path and the central output port,
wherein a second matching unit is integrated between the first and the second signal paths and the measurement port,
wherein the first signal path is divided into two signal lines by the integration of the first matching unit,
wherein a first signal line connects the first balun output connector to the first matching unit,
wherein a second signal line connects the first matching unit to the second matching unit,
wherein the first matching unit is integrated for transforming the impedance of the first signal line to an impedance that is approximately the same as the impedance of the central output port, and
wherein the second matching unit is integrated for transforming the impedance of the second signal line to an impedance that is approximately the same as the impedance of the measurement port.

2. The measurement bridge according to claim 1, wherein the measurement bridge is built on a printed circuit board.

3. The measurement bridge according to claim 1,
wherein the first matching unit comprises four resistors having a first and a second resistor connected to the first signal line and a third and a forth resistor connected to the second signal line, wherein the first and the third resistor are further connected to ground and wherein the second and fourth resistor are further connected to the central output port, and/or
wherein the second matching unit comprises four resistors having a first and a second resistor connected to the second signal line and a third and a fourth resistor connected to the second signal path, wherein the first and the third resistor are further connected to ground and wherein the second and fourth resistor are further connected to the measurement port.

4. The measurement bridge according to claim 1,
wherein the first matching unit comprises four resistors having a first and a second resistor connected to the first signal line and a third and a fourth resistor connected to the second signal line, wherein the first and the third resistor are further connected to ground and wherein the second and fourth resistor are further connected to the central output port, and/or
wherein the second matching unit comprises four resistors having a first and a second resistor connected to the second signal line and a third and a fourth resistor connected to the second signal path, wherein the first and the third resistor are further connected to ground and wherein the second and fourth resistor are further connected to the measurement port.

5. The measurement bridge according to claim 3, wherein the first and the second and the third and the fourth resistor of the first and the second matching unit are obtained by thick film resistor paste dispensed on a ceramic layer being trimmed by a laser to desired values.

6. The measurement bridge according to claim 1, wherein the measurement bridge is extended by a DC-Feed using a capacitor in series around a Bias-Tee between the first matching unit and the central output port.

7. The measurement bridge according to claim 1,
wherein at least one resistor is connected between ground and the second signal path,
wherein at least another resistor is connected in series within the second signal path, and
wherein the second signal path comprises a transmission line.

8. The measurement bridge according to claim 2,
wherein at least one resistor is connected between ground and the second signal path,
wherein at least another resistor is connected in series within the second signal path, and
wherein the second signal path comprises a transmission line.

9. The measurement bridge according to claim 7, wherein a circuitry in the second signal path comprising the at least one resistor, the at least another resistor and the transmission line ensures that the electrical length of the second signal path and the attenuation of the second signal path are approximately the same as the electrical length and the attenuation of the first signal path.

10. The measurement bridge according to claim 9,
wherein the measurement bridge is built on a printed circuit board,
wherein a recess is formed within the printed circuit board so that a metal layer of an outermost substrate layer of the printed circuit board is visible,
wherein the at least one resistor and a resistor which connects the second signal path to the reference port are arranged, and
wherein the resistor is also a part of the circuitry.

11. The measurement bridge according to claim 2,
wherein the balun comprises a coaxial cable that is wound up within a ferrite, wherein the balun is mounted on the printed circuit board and wherein no metal layer is formed within the printed circuit board beneath the balun, and/or
wherein an outer conductor of the coaxial cable is insulated as to ensure that no electrical contact is possible between the coaxial cable itself as well the ferrite core.

12. The measurement bridge according to claim 1, wherein the electrical parameters comprise the attenuation and the electrical length of each signal path.

13. The measurement bridge according to claim 1, wherein the measurement bridge is configured for a network analyzer.

* * * * *